United States Patent
Lin

(10) Patent No.: US 10,727,690 B2
(45) Date of Patent: Jul. 28, 2020

(54) UNINTERRUPTIBLE POWER SUPPLY CONTROL DEVICE, OPERATION METHOD OF UNINTERRUPTIBLE POWER SUPPLY CONTROL DEVICE, AND SMART TEXTILE

(71) Applicant: INTELLIGENCE TEXTILE TECHNOLOGY CO., LTD., Taipei (TW)

(72) Inventor: Chen-Hsiang Lin, Taipei (TW)

(73) Assignee: INTELLIGENCE TEXTILE TECHNOLOGY CO., LTD. (TW)

( * ) Notice: Subject to any disclaimer, the term of this patent is extended or adjusted under 35 U.S.C. 154(b) by 183 days.

(21) Appl. No.: 16/052,671

(22) Filed: Aug. 2, 2018

(65) Prior Publication Data

US 2019/0334374 A1  Oct. 31, 2019

(30) Foreign Application Priority Data

Apr. 27, 2018  (TW) .............................. 107114591 A

(51) Int. Cl.
  *H02J 9/06*   (2006.01)
  *G01R 19/165*   (2006.01)
  *G01R 19/25*   (2006.01)

(52) U.S. Cl.
  CPC .......... *H02J 9/06* (2013.01); *G01R 19/16519* (2013.01); *G01R 19/16538* (2013.01); *G01R 19/2513* (2013.01)

(58) Field of Classification Search
  None
  See application file for complete search history.

(56) References Cited

U.S. PATENT DOCUMENTS

2011/0156839 A1* 6/2011 Martin ............... H03K 17/9622
                                                      333/172
2018/0060197 A1* 3/2018 Lee ........................... G06F 1/30

* cited by examiner

*Primary Examiner* — Jared Fureman
*Assistant Examiner* — Aqeel H Bukhari
(74) *Attorney, Agent, or Firm* — Schmeiser, Olsen & Watts, LLP

(57) ABSTRACT

An operation method of an uninterruptible power supply control device is described below. The uninterruptible power supply control device is electrically coupled to a voltage output terminal of a portable power device and a ground terminal of the portable power device. At least one electrical power conversion device has one end electrically coupled to the voltage output terminal and the other end electrically coupled to the ground terminal. If the portable power device's current is less than a threshold current of the portable power device and maintained for a first duration which is less than a threshold duration of the portable power device, an enabling current greater or equal to the threshold current is generated between the voltage output terminal and the ground terminal and as part of the current.

16 Claims, 4 Drawing Sheets

UNINTERRUPTIBLE POWER SUPPLY CONTROL DEVICE, OPERATION METHOD OF UNINTERRUPTIBLE POWER SUPPLY CONTROL DEVICE, AND SMART TEXTILE

CROSS-REFERENCE TO RELATED APPLICATION

This non-provisional application claims priority under 35 U.S.C. § 119(a) on Patent Application No(s). 107114591 filed in Taiwan, R.O.C. on Apr. 27, 2018, the entire contents of which are hereby incorporated by reference.

TECHNICAL FIELD

The present disclosure relates to an uninterruptible power supply control device, and more particularly, to an uninterruptible power supply control device that prevents a portable power source from automatically stopping the supply of power, an operation method of the uninterruptible power supply control device and a smart textile.

RELATED ART

In recent years, wearable technologies such as smart watches, sports bracelets and other products have become more diversified, and the related industries like smart textile (for example, smart clothing) have developed rapidly. As the related technologies of smart textile become more mature, smart textile is applied in various fields such as human body signal detection, body temperature control or display devices, and the smart textile is widely used in heating applications. However, when an external portable power source is used for heating a exist smart textile, the current drawn from the portable power source is small because the smart textile has a relatively large resistance and resulting in the portable power source's automatically stopping the power supply, and the heating of smart textile is insufficient.

Thus, users need to reconnect the portable power source to the smart textile frequently in order for the heating system of the smart textile to be reheated, but to the detriment of user experience. In the worst-case scenario, it may cause the users to get cold and uncomfortable.

Therefore, one of the important issues is how to solve the technical problem that the portable power source automatically stops heating during the heating process of the smart textile and resulting in insufficient heating.

SUMMARY

An objective of the present disclosure is to prevent a portable power device from stopping power supply automatically, so as to ensure stable heating and maintain the temperature of smart textile.

To achieve at least the above objective, the present disclosure provides an operation method of an uninterruptible power supply control device comprising the following steps. First, the uninterruptible power supply control device and at least one electrical energy conversion device are provided, wherein the uninterruptible power supply control device is electrically coupled to a voltage output terminal and a ground terminal of a portable power device, one end of the at least one electrical energy conversion device is electrically coupled to the voltage output terminal and the other end of the at least one electrical energy conversion device is electrically coupled to the ground terminal. And then, an enabling current is generated for as part of a current of the portable power device by the uninterruptible power supply control device according to a current value of the current and a first duration of the current, wherein the current is less than a threshold current of the portable power device in the first duration, the enabling current is equal to or greater than the threshold current, the first duration is less than a threshold duration of the portable power device, and when a duration of the current is equal to or greater than the threshold duration, the portable power device shuts down and stops supplying the power.

To achieve at least the above objective, the present disclosure provides an uninterruptible power supply control device comprising a microcontroller. The microcontroller is electrically coupled to a portable power device having a voltage output terminal and a ground terminal and at least one electrical energy conversion device and is configured to generate an enabling current as part of a current of the portable power device according to a current value and a first duration of the current, wherein one end of the at least one electrical energy conversion device is electrically coupled to the voltage output terminal and the microcontroller and the other end of the at least one electrical energy conversion device is electrically coupled to the ground terminal and the microcontroller, the current is less than a threshold current of the portable power device in the first duration, the enabling current is equal to or greater than the threshold current, the first duration is less than a threshold duration of the portable power device, and when a duration of the current is equal to or greater than the threshold duration, the portable power device shuts down and stops power supply.

To achieve at least the above objective, the present disclosure provides a smart textile comprising an uninterruptible. The uninterruptible power supply control device is electrically coupled to a portable power device having a voltage output terminal and a ground terminal and at least one electrical energy conversion device and is configured to generate an enabling current as part of a current of the portable power device according to a current value and a first duration of the current, wherein one end of the at least one electrical energy conversion device is electrically coupled to the voltage output terminal and the uninterruptible power supply control device and the other end of the at least one electrical energy conversion device is electrically coupled to the ground terminal and the uninterruptible power supply control device, the current is less than a threshold current of the portable power device in the first duration, the enabling current is equal to or greater than the threshold current, the first duration is less than a threshold duration of the portable power device, and when a duration of the current is equal to or greater than the threshold duration, the portable power device stop power supply.

In an embodiment of the present disclosure, the uninterruptible power supply control device further generates a control signal according to the current value and the first duration.

In an embodiment of the present disclosure, the uninterruptible power supply control device further comprises a current generation circuit electrically coupled between the voltage output terminal and the ground terminal for forming a conduction path between the voltage output terminal and the ground terminal and generating the enabling current.

In an embodiment of the present disclosure, the first duration is equal to or greater than an enabling threshold duration of the uninterruptible power supply control device, and the enabling threshold duration is less than the threshold duration.

DETAILED DESCRIPTION OF THE PREFERRED EMBODIMENTS

To make it easier for the examiner to understand the objects, characteristics and effects of this present disclosure, embodiments together with the attached drawings for the detailed description of the present disclosure are provided.

Figure 1A:
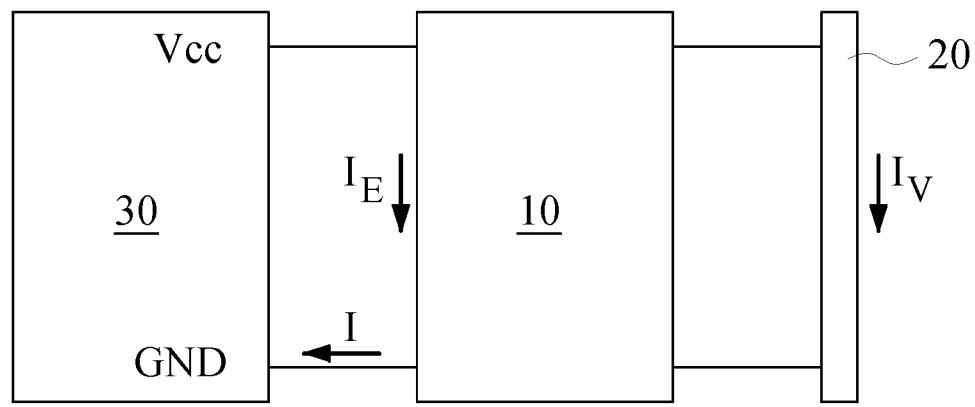
FIG. 1A is a schematic diagram illustrating a circuit having an uninterruptible power supply control device according to an embodiment of the present disclosure.

Please refer to FIG. 1A, and FIG. 1A is a schematic diagram illustrating a circuit having an uninterruptible power supply control device according to an embodiment of the present disclosure. The uninterruptible power supply control device 10 is electrically coupled to at least one electrical energy conversion device 20 (For example, a signaling yarn or an enameled wire for heating smart textile and having larger resistance.) and a portable power device 30. The portable power device 30 has a voltage output terminal Vcc for supplying a voltage (power) to an electrical load (such as the uninterruptible power supply control device 10 and the electrical energy conversion device 20) electrically coupled to the portable power device 30. In the embodiment, the voltage might be 5 volts, and the portable power device 30 is implemented by power banks, but is not intending to limit the present disclosure.

In the embodiment, the portable power device 30 determines whether to stop supplying the power according to a current I. More specifically, the portable power device 30 determines whether the current I is less than a threshold current $I_T$ and determines whether a duration of current I when current I is less than the threshold current $I_T$ is equal to or greater than a threshold duration of the portable power device 30. When the portable power device 30 determines that the duration of the current I when current I is less than the threshold current $I_T$ is equal to or greater than the threshold duration, the portable power device 30 stops the supply of the power. In the embodiment, the threshold current $I_T$ is 1 ampere, the threshold duration is 3 to 5 seconds, and the present disclosure is not limited thereto.

Figure 2A:
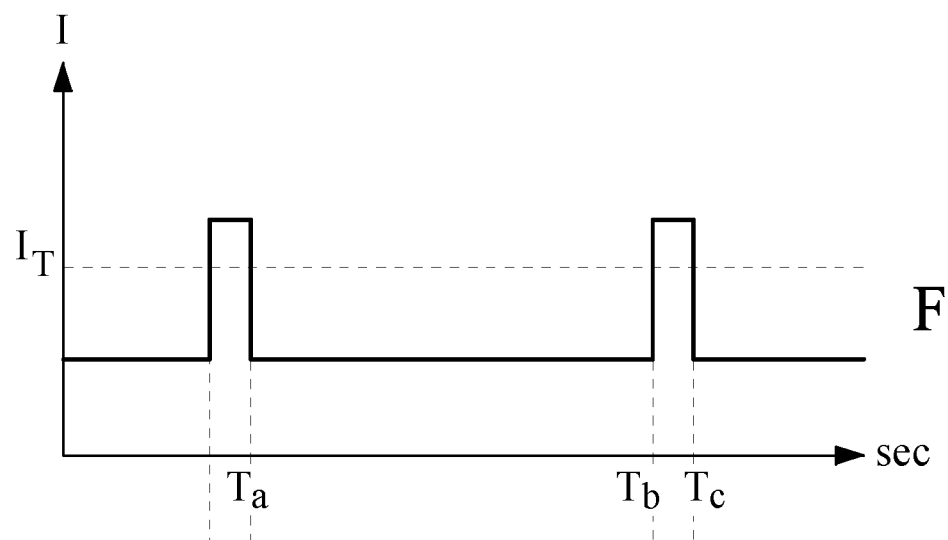
FIG. 2A is a timing schematic diagram of a current I according to an embodiment of the present disclosure.

The uninterruptible power supply control device 10 continuously monitors the current I to determine whether the current I is less than the threshold current $I_T$ and monitors that whether a first duration $T_{D1}$ (as shown in FIG. 2A) of the current I when current I is less than the threshold current $I_T$ is equal to or greater than an enable threshold duration. When the first duration $T_{D1}$ is equal to or greater than the enabling threshold duration, the uninterruptible power supply control device 10 generates an enabling current $I_E$ as part of the current I and provided to the portable power device 30 (The current I is a sum of a load current $I_V$ and the enabling current $I_E$. When the load current $I_V$ is very small, the current I and the enabling current $I_E$ are approximate). In the embodiment, the enabling threshold duration is less than the threshold duration of the portable power device 30. In addition, the current value of the enabling current $I_E$ is equal to or greater than the current value of the threshold current $I_T$, and the enabling current $I_E$ is held in a second duration $T_{D2}$ (as shown in FIG. 2A). Thus, the portable power device 30 can receive the enabling current $I_E$ certainly. In an embodiment, the enabling current $I_E$ is 1 to 3 ampere in order to correspond to the current value of the threshold current $I_T$, such as 1, 1.5 or 2 ampere, and the present disclosure is not limited thereto. In the embodiment, the uninterruptible power supply control device 10 is implemented by microcontroller, such as microcontroller chip or smart textile control chip, and the present disclosure is not limited thereto.

In an embodiment, the second duration $T_{D2}$ is 0.05 to 1 second, such as 0.1, 0.8 or 1 seconds. The first duration $T_{D1}$ is equal to or great than the enabling threshold duration and 2 to 4 seconds, and the present disclosure is not limited thereto. Preferably, for the purpose of power saving, the second duration $T_{D2}$ may even be several milliseconds, and the enabling current $I_E$ is essentially a current pulse. Preferably, for the convenience of design, the enabling threshold duration can be designed to be 2 seconds.

Figure 1B:
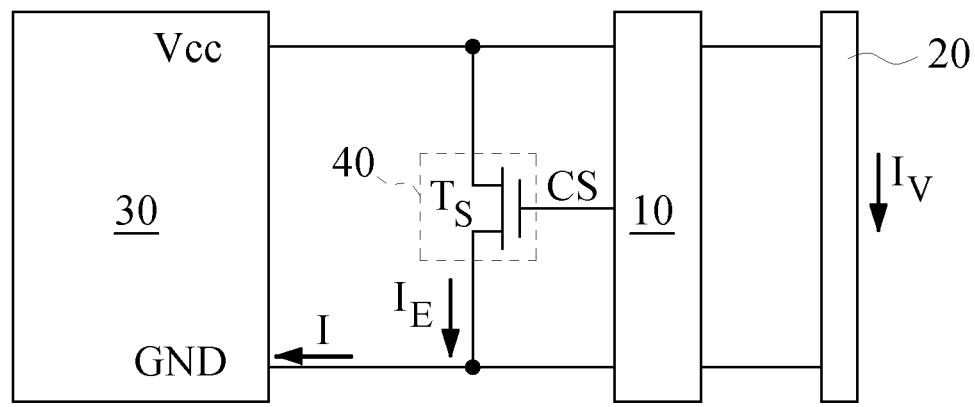
FIG. 1B is a schematic diagram illustrating a circuit having an uninterruptible power supply control device according to another embodiment of the present disclosure.

Please refer to FIG. 1B, and FIG. 1B is a schematic diagram illustrating a circuit having an uninterruptible power supply control device according to another embodiment of the present disclosure. The difference between FIG. 1A and FIG. 1B is that FIG. 1B further has a current generation circuit 40. The current generation circuit 40 is electrically coupled between the voltage output terminal Vcc and the ground terminal GND and electrically coupled to the uninterruptible power supply control device 10 for receiving a control signal CS. The current generation circuit 40 forms a conduction path between the voltage output terminal Vcc and the ground terminal GND according to the control signal CS and generates the enabling current $I_E$. In one embodiment, the current generation circuit 40 can dispose in the uninterruptible power supply control device 10 for different requirement, and the present disclosure is not limited thereto.

In the embodiment, the current generation circuit 40 is implemented by a transistor TS, and the present disclosure is not limited thereto. The transistor TS has a first terminal, a second terminal and a control terminal, the first terminal is one of the source/drain terminal and electrically coupled to the voltage output terminal Vcc, the second terminal is the other one of the source/drain terminal and electrically coupled to the ground terminal GND, and the control terminal receives the control signal CS. Thus, the transistor TS determines whether to turn on the first terminal and the second terminal according to the control signal CS to form the conduction path between the voltage output terminal Vcc and the ground terminal GND for generating the enabling current $I_E$ that flows through the transistor TS.

When the current generation circuit 40 forms the conduction path between the voltage output terminal Vcc and the ground terminal GND according to the control signal CS generated by the uninterruptible power supply control device 10, an equivalent resistance of the conduction path of the current generation circuit 40 is much less than the resistance of the electrical energy conversion device 20.

Therefore, the enabling current $I_E$ from the voltage output terminal Vcc to the ground terminal GND through the current generation circuit 40 is generated, and the enabling current $I_E$ is provided to the portable power device 30 as part of the current I.

Figure 2B:
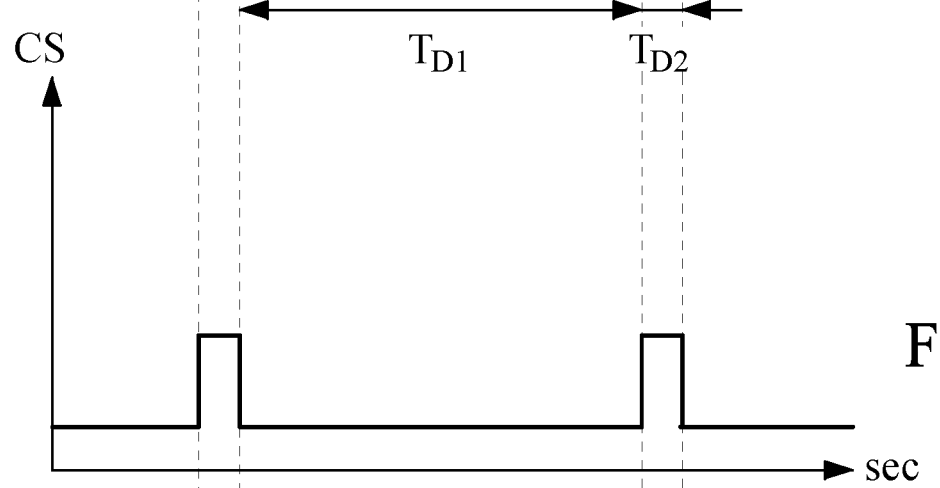
FIG. 2B is a timing schematic diagram of a control signal CS according to an embodiment of the present disclosure.
Figure 2C:
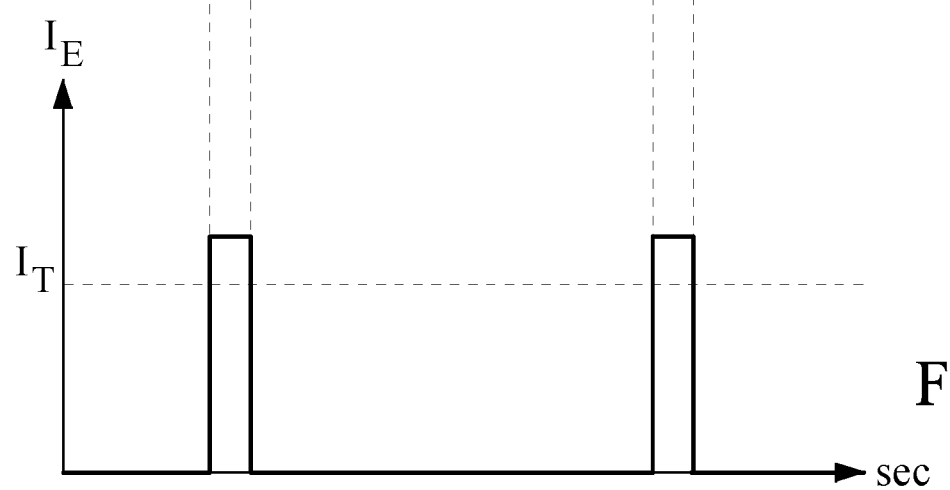
FIG. 2C is a timing schematic diagram of an enabling current $I_E$ according to an embodiment of the present disclosure.

An operation method of the uninterruptible power supply control device 10 will be described with the attached drawings in the following descriptions. Referring to FIGS. 1B, 2A, 2B and 2C, FIG. 2A is a timing schematic diagram of the current I according to the embodiment of the present disclosure, FIG. 2B is a timing schematic diagram of the control signal CS according to the embodiment of the present disclosure, and FIG. 2C is a timing schematic diagram of the enabling current $I_E$ according to the embodiment of the present disclosure. In FIGS. 2A and 2C, the unit of a horizontal axis is seconds, and the unit of a vertical axis is ampere. In FIG. 2B, the unit of a horizontal axis is seconds, and the unit of a vertical axis is volts. Enabling voltage level of the control signal CS is logic high level, and the present disclosure is not limited thereto.

In the embodiment, when the portable power device 30 is supplying the power, the uninterruptible power supply control device 10 monitors the current value of the current I continuously and determines whether the current I is less than the threshold current $I_T$ and whether the duration of current I when current I is less than the threshold current $I_T$ is equal to or greater than the enabling threshold duration. As shown in FIG. 2A, between a time point Ta and a time point Tb, the current I is less than the threshold current $I_T$. Thus, in the time point Tb, the uninterruptible power supply control device 10 determined that the current I is less than the threshold current $I_T$ for a period of time, and the period of time is the first duration $T_{D1}$. At the same time, the first duration $T_{D1}$ is equal to or greater than the enabling threshold duration of the uninterruptible power supply control device 10 in the time point Tb. As shown in FIG. 2B, the uninterruptible power supply control device 10 generates the control signal CS having the enabling voltage level in the time point Tb to a time point Tc. According to the control signal CS, the current generation circuit 40 conducts the path between the voltage output terminal Vcc and the ground terminal GND and forms the conduction path for generating the enabling current $I_E$. Therefore, in the FIG. 2C, the enabling current $I_E$ is generated between the time point Tb and the time point Tc, and the enabling current $I_E$ is greater than the threshold current $I_T$, but the present disclosure is not limited thereto. For example, the enabling current $I_E$ might be equal to the threshold current $I_T$. However, in order to avoid that the load current $I_V$ is too small and the resolution of the detection current is insufficient, the current value of the enabling current $I_E$ is preferably designed to be greater than the threshold current $I_T$. Therefore, as shown in FIG. 2A, between the time point Tb and the time point Tc, the current value of the current I is increased to the current value of the enabling current $I_E$ according to the enabling current $I_E$ (in the embodiment, the load current $I_V$ is much smaller than the enabling current $I_E$). In the embodiment, the period of the time between the time point Tb and the time point Tc is the second duration $T_{D2}$.

Therefore, the uninterruptible power supply control device 10 according to the embodiment of the present disclosure provides the enabling current $I_E$ that equal to or greater than the threshold current $I_T$ as part of the current I before the duration of current I when the current I is less than the threshold current $I_T$ is equal to or greater than the threshold duration. Thus the portable power device 30 can supply the power continuously according to the enabling current $I_E$ and will not stop supplying the power because the duration of the current I is equal to or grater than the threshold duration when the current I is small. The drawbacks of the exists operation that the portable power device 30 automatically stops supplying the power because the duration of current I is greater than the threshold duration when the current I is less than the threshold current $I_T$ are solved.

Figure 3:
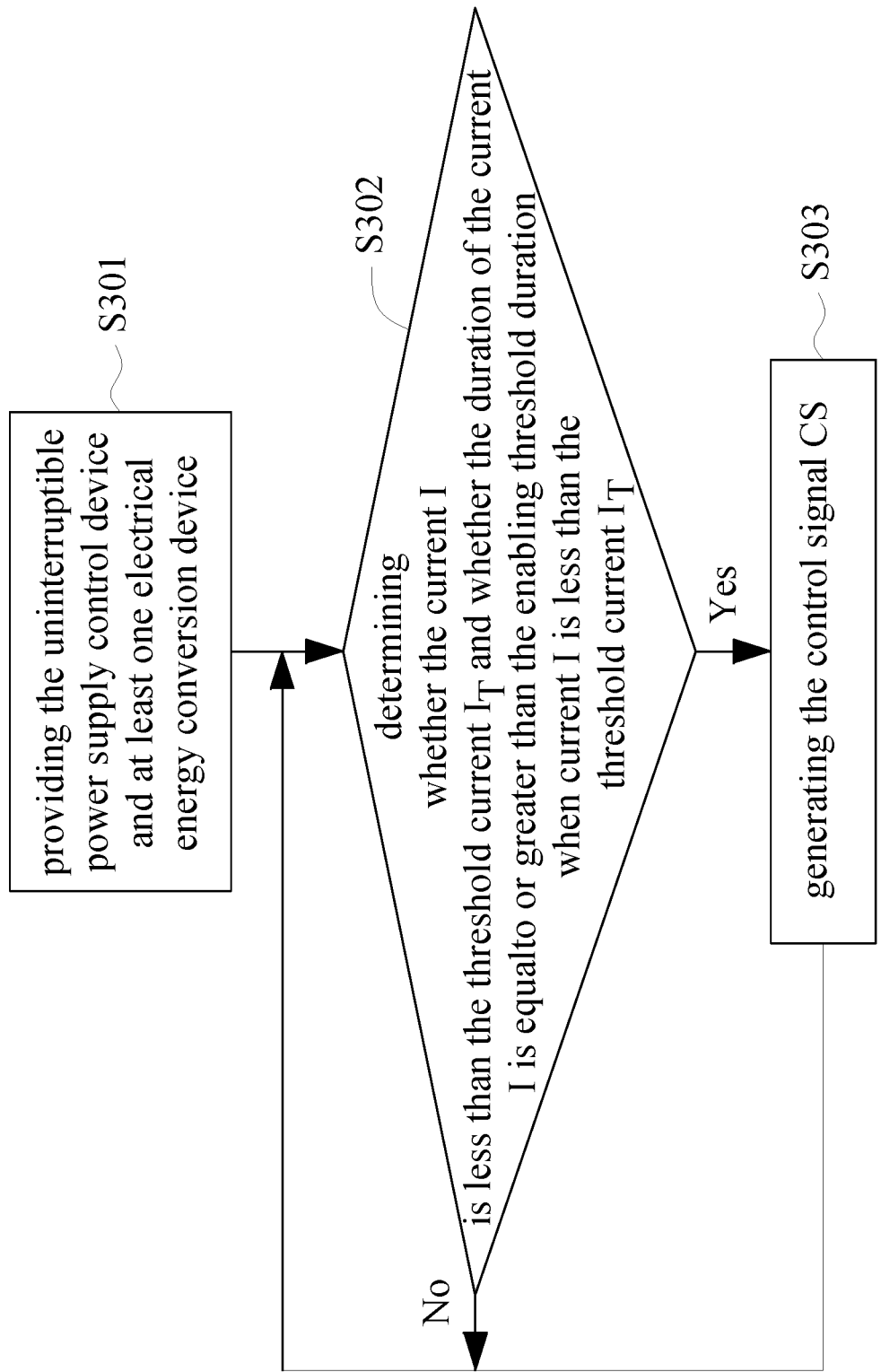
FIG. 3 is a flow chart of an operation method of the uninterruptible power supply control device according to an embodiment of the present disclosure.

According to the above, the operation method of the uninterruptible power supply control device can be summarized. Please refer to FIG. 3, and FIG. 3 is a flow chart of the operation method of the uninterruptible power supply control device according to an embodiment of the present disclosure. In the step S301, the uninterruptible power supply control device 10 and at least one electrical energy conversion device 20 are provided. More specifically, one end of the at least one electrical energy conversion device 20 and the uninterruptible power supply control device 10 are electrically coupled to the voltage output terminal Vcc of the portable power device 30, and the other end of the at least one electrical energy conversion device 20 and the uninterruptible power supply control device 10 are electrically coupled to the ground terminal GND of the portable power device 30.

In the step S302, the uninterruptible power supply control device 10 determines whether the current I is less than the threshold current $I_T$ and whether the duration of the current I is equal to or greater than the enabling threshold duration when current I is less than the threshold current $I_T$. More specifically, the uninterruptible power supply control device 10 monitors the current value of current I and determines whether the current I is less than the threshold current $I_T$, and the uninterruptible power supply control device 10 also monitors and determines whether the first duration $T_{D1}$ of current I is equal to or greater than the enabling threshold duration when the current value of current I is less than the threshold current $I_T$. The enabling threshold duration of the uninterruptible power supply control device 10 is less than the threshold duration of the portable power device 30. When the uninterruptible power supply control device 10 determines that the current value of the current I is less than the threshold current $I_T$ and the first duration $T_{D1}$ is equal to or greater than the enabling threshold duration, the flow goes to the step S303, otherwise, back to the step S302.

In step S303, the uninterruptible power supply control device 10 generates the control signal CS. According to the control signal CS, the current generation circuit 40 forms the conduction path between the voltage output terminal Vcc and the ground terminal GND and generates the enabling current $I_E$, and the enabling current $I_E$ is as part of the current I.

Therefore, when the portable power device 30 obtained the current I having the enabling current $I_E$, the portable power device 30 does not need to stop the power supply according to the current I and supplies the power to the electrical load (electrical energy conversion device 20) continually because the first duration $T_{D1}$ of the current I is less than the threshold duration.

Figure 4:
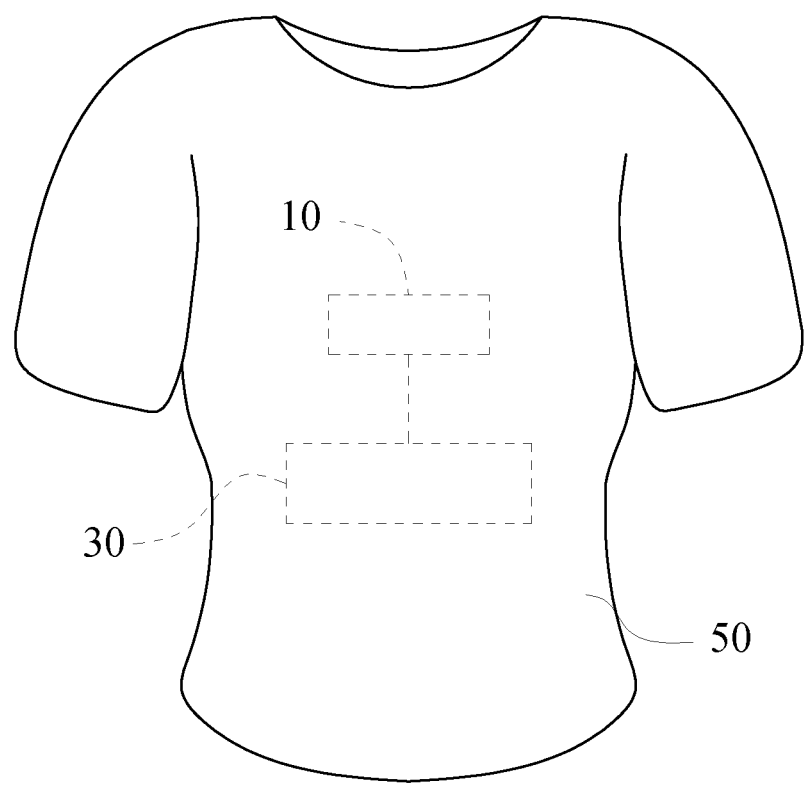
FIG. 4 is a configuration schematic diagram of the uninterruptible power supply control device according to an embodiment of the present disclosure.

Please refer to FIG. 4, and FIG. 4 is a configuration schematic diagram of the uninterruptible power supply control device according to an embodiment of the present disclosure. In the embodiment, the uninterruptible power supply control device 10 is disposed at a smart textile 50 having at least one electrical energy conversion device 20, the portable power device 30 might be disposed at the smart textile 50, and the present disclosure is not limited thereto. Therefore, the smart textile 50 of the embodiment can provide power to the at least one electrical energy conversion device 20 through the portable power device 30 for heating. The user can keep the temperature and feel warm by wear the smart textile 50. In addition, according to the uninterruptible power supply control device 10 of the present disclosure, the portable power device 30 does not automatically stop supplying the power. Thus, the smart textile 50 can heat up and maintain temperature for preventing the user from catching cold.

In summary, the uninterruptible power supply control device and the operation method according to the embodiment of the present disclosure can keep the duration of the current I (when current I is less than the threshold current $I_T$) less than the threshold duration of the portable power device 30 by generate the enabling current $I_E$ equal to or greater than the threshold current $I_T$ as part of the current I of the portable power device 30, wherein the duration of the current I means how long the current I lasts when current I is less than the threshold current $I_T$. Therefor, the portable power device 30 does not stop the supply of power because the duration is less than the threshold duration of the portable power device 30. The smart textile 50 configured with the uninterruptible power supply control device 10 can supply the power stably to at least one electrical energy conversion device for maintaining the temperature of the smart textile 50, so as to improve user experience.

While the present disclosure has been described by means of specific embodiments, numerous modifications and variations could be made thereto by those skilled in the art without departing from the scope and spirit of the present disclosure set forth in the claims.

What is claimed is:

1. An operation method of an uninterruptible power supply control device, comprising the steps of:
    providing the uninterruptible power supply control device and at least one electrical energy conversion device, wherein the uninterruptible power supply control device is electrically coupled to a voltage output terminal and a ground terminal of a portable power device, one end of the at least one electrical energy conversion device is electrically coupled to the voltage output terminal and the other end of the at least one electrical energy conversion device is electrically coupled to the ground terminal; and
    generating an enabling current as part of a current of the portable power device by the uninterruptible power supply control device according to a current value of the current and a first duration of the current,
    wherein the current is less than a threshold current of the portable power device in the first duration, the enabling current is equal to or greater than the threshold current, the first duration is less than a threshold duration of the portable power device, and when a duration of the current is equal to or greater than the threshold duration, the portable power device shuts down and stops supplying the power.

2. The operation method according to claim 1, the operation method further comprising:
    generating a control signal according to the current value and the first duration.

3. The operation method according to claim 2, wherein the uninterruptible power supply control device further comprises a current generation circuit electrically coupled between the voltage output terminal and the ground terminal.

4. The operation method according to claim 3, wherein the current generation circuit forms a conduction path between the voltage output terminal and the ground terminal for generating the enabling current.

5. The operation method according to claim 4, wherein the current generation circuit is a transistor having a first terminal, a second terminal and a control terminal, the first terminal is electrically coupled to the voltage output terminal, the second terminal is electrically coupled to the ground terminal, the control terminal receives the control signal, and the transistor determines whether to turn on the first terminal and the second terminal according to the control signal.

6. The operation method according to claim 1, wherein the first duration is equal to or greater than an enabling threshold duration of the uninterruptible power supply control device and the enabling threshold duration is less than the threshold duration.

7. An uninterruptible power supply control device, comprising:
    a microcontroller, electrically coupled to a portable power device having a voltage output terminal and a ground terminal and at least one electrical energy conversion device, configured to generate an enabling current as part of a current of the portable power device according to a current value and a first duration of the current,
    wherein one end of the at least one electrical energy conversion device is electrically coupled to the voltage output terminal and the microcontroller and the other end of the at least one electrical energy conversion device is electrically coupled to the ground terminal and the microcontroller, the current is less than a threshold current of the portable power device in the first duration, the enabling current is equal to or greater than the threshold current, the first duration is less than a threshold duration of the portable power device, and when a duration of the current is equal to or greater than the threshold duration, the portable power device stop power supply.

8. The uninterruptible power supply control device of claim 7, wherein the microcontroller further generates a control signal according to the current value and the first duration.

9. The uninterruptible power supply control device of claim 8, the uninterruptible power supply control device further comprising:
    a current generation circuit, electrically coupled between the voltage output terminal and the ground terminal for forming a conduction path between the voltage output terminal and the ground terminal and generating the enabling current.

10. The uninterruptible power supply control device of claim 9, wherein the current generation circuit is a transistor having a first terminal, a second terminal and a control terminal, the first terminal is electrically coupled to the voltage output terminal, the second terminal is electrically coupled to the ground terminal, the control terminal receives the control signal, and the transistor determines whether to turn on the first terminal and the second terminal according to the control signal.

11. The uninterruptible power supply control device of claim 7, wherein the first duration is equal to or greater than an enabling threshold duration of the uninterruptible power supply control device, and the enabling threshold duration is less than the threshold duration.

12. A smart textile, comprising:
    an uninterruptible power supply control device, electrically coupled to a portable power device having a voltage output terminal and a ground terminal and at least one electrical energy conversion device, configured to generate an enabling current as part of a current of the portable power device according to a current value and a first duration of the current, wherein one end of the at least one electrical energy conversion device is electrically coupled to the voltage output terminal and the uninterruptible power supply control device and the other end of the at least one electrical energy conversion device is electrically coupled to the ground terminal and the uninterruptible power supply control device, the current is less than a threshold current of the portable power device in the first duration, the enabling current is equal to or greater than the threshold current, the first duration is less than a threshold duration of the portable power device, and the portable power device stops power supply when a duration of the current is equal to or greater than the threshold duration.

13. The smart textile of claim 12, wherein the uninterruptible power supply control device further generates a control signal according to the current value and the first duration.

14. The smart textile of claim 13, wherein the uninterruptible power supply control device further comprising:

a current generation circuit, electrically coupled between the voltage output terminal and the ground terminal for forming a conduction path between the voltage output terminal and the ground terminal and generating the enabling current.

15. The smart textile of claim 14, wherein the current generation circuit is a transistor having a first terminal, a second terminal and a control terminal, the first terminal is electrically coupled to the voltage output terminal, the second terminal is electrically coupled to the ground terminal, the control terminal receives the control signal, and the transistor determines whether to turn on the first terminal and the second terminal according to the control signal.

16. The smart textile of claim 12, wherein the first duration is equal to or greater than an enabling threshold duration of the uninterruptible power supply control device and the enabling threshold duration is less than the threshold duration.

* * * * *